(12) United States Patent
Lang et al.

(10) Patent No.: US 8,314,541 B2
(45) Date of Patent: Nov. 20, 2012

(54) RADIATION-EMITTING ARRANGEMENT

(75) Inventors: Erwin Lang, Regensburg (DE); Markus Klein, Tegernheim (DE); Martin Wittmann, Regensburg (DE); Dirk Becker, Langquaid (DE); Thomas Dobbertin, Regensburg (DE); Arndt Jaeger, Regensburg (DE); Karsten Diekmann, Rattenberg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 20 days.

(21) Appl. No.: 12/919,752

(22) PCT Filed: Feb. 25, 2009

(86) PCT No.: PCT/DE2009/000279
§ 371 (c)(1),
(2), (4) Date: Feb. 14, 2011

(87) PCT Pub. No.: WO2009/106067
PCT Pub. Date: Sep. 3, 2009

(65) Prior Publication Data
US 2011/0163659 A1 Jul. 7, 2011

(30) Foreign Application Priority Data

Feb. 26, 2008 (DE) .......................... 10 2008 011 239
May 16, 2008 (DE) .......................... 10 2008 023 874

(51) Int. Cl.
*H01J 1/62* (2006.01)
(52) U.S. Cl. ...................................................... 313/498
(58) Field of Classification Search .......... 313/498–500, 313/506
See application file for complete search history.

(56) References Cited

U.S. PATENT DOCUMENTS

| 2004/0164674 A1 | 8/2004 | Ottermann et al. |
| 2005/0105303 A1 | 5/2005 | Emde |
| 2006/0086020 A1* | 4/2006 | Strip et al. ...................... 40/544 |
| 2007/0240346 A1* | 10/2007 | Li et al. ........................... 40/544 |
| 2007/0273281 A1 | 11/2007 | Biebel |
| 2009/0097234 A1 | 4/2009 | von Malm |

FOREIGN PATENT DOCUMENTS

| DE | 101 48 821 | 4/2003 |
| DE | 102 05 405 | 8/2003 |
| DE | 103 08 515 | 9/2004 |
| DE | 103 28 140 | 1/2005 |
| DE | 10 2004 053 631 | 8/2006 |

(Continued)

*Primary Examiner* — Anh Mai
*Assistant Examiner* — Brenitra Lee
(74) *Attorney, Agent, or Firm* — Cozen O'Connor

(57) ABSTRACT

A radiation-emitting arrangement comprises, in particular, a carrier element (1) having an at least partly non-transparent main surface (10) and arranged on the carrier element (1), an organic radiation-emitting component (2) having an organic layer sequence (23) with an active region between an at least partly transparent first electrode (21) and an at least partly transparent second electrode (22). The active region (29) is suitable for generating electromagnetic radiation (91, 93) in a switched-on operating state. The radiation-emitting arrangement has a radiation exit area (3) for emitting the electromagnetic radiation (92, 93) on that side of the organic radiation-emitting component (2) which faces away from the carrier element. (1) The at least partly non-transparent main surface (10) of the carrier element (1) is perceptible by an external observer through the radiation exit area (3) in a switched-off operating state of the organic radiation-emitting component (2).

15 Claims, 5 Drawing Sheets

FOREIGN PATENT DOCUMENTS

| | | |
|---|---|---|
| DE | 20 2006 007 482 | 8/2006 |
| DE | 10 2006 060 781 | 4/2008 |
| DE | 10 2007 054 037 | 4/2009 |
| JP | 2003-151337 | 5/2003 |
| WO | WO 03/036596 | 5/2003 |
| WO | WO 03/067014 | 8/2003 |
| WO | WO 2004/084324 | 9/2004 |
| WO | WO 2006/049807 | 5/2006 |
| WO | WO 2007/031366 | 3/2007 |
| WO | WO 2007/128341 | 11/2007 |
| WO | WO 2008/040323 | 4/2008 |

* cited by examiner

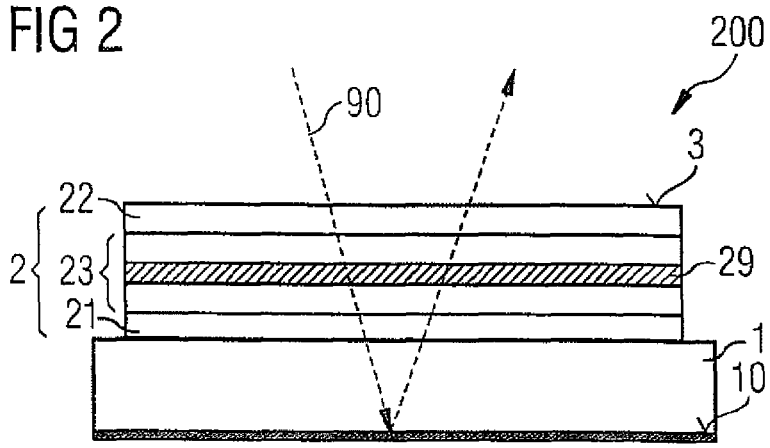
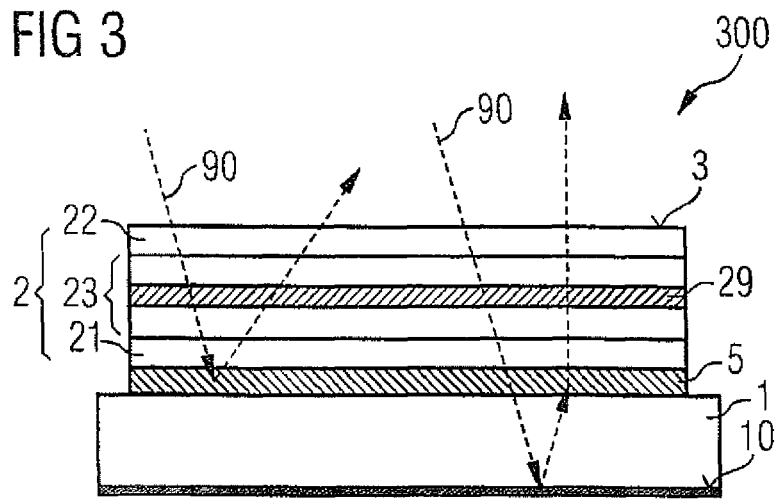
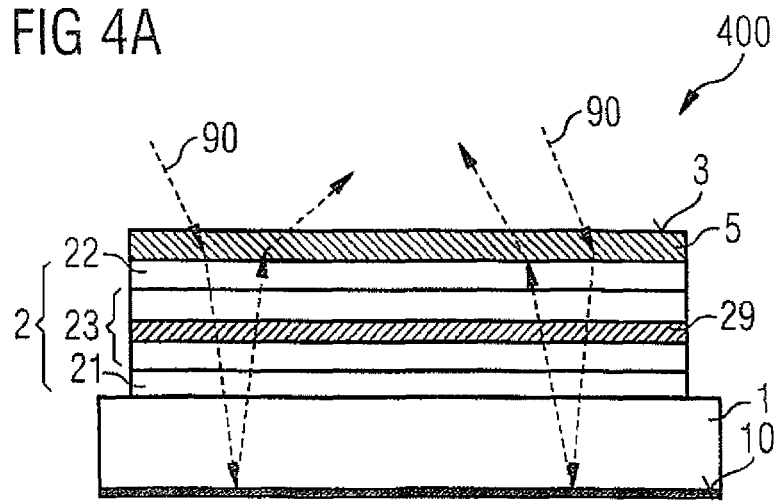

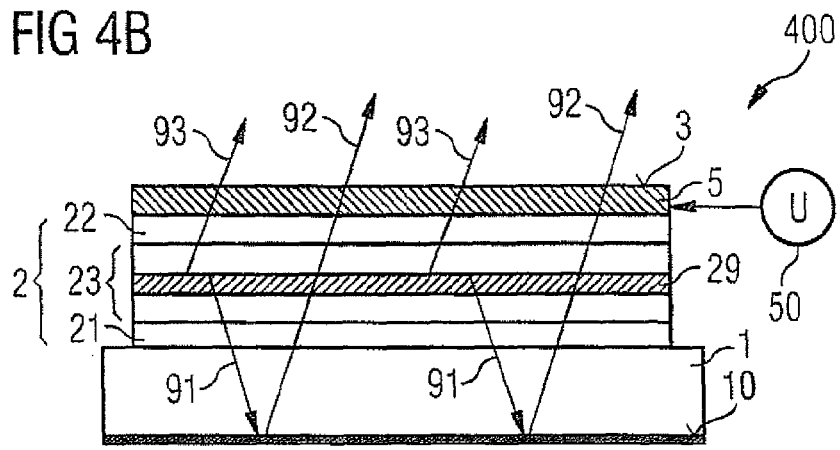
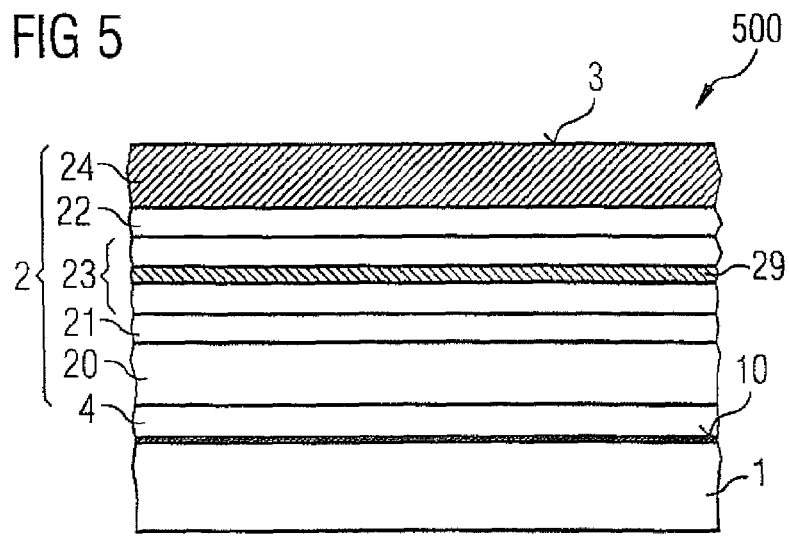
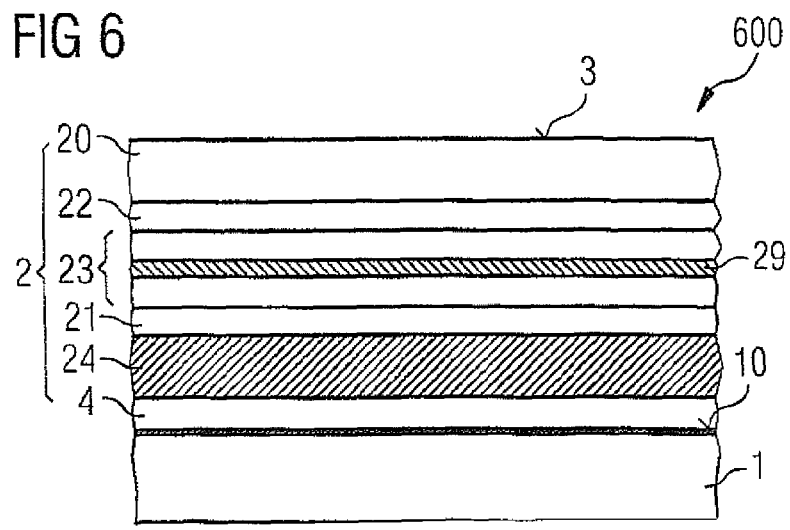

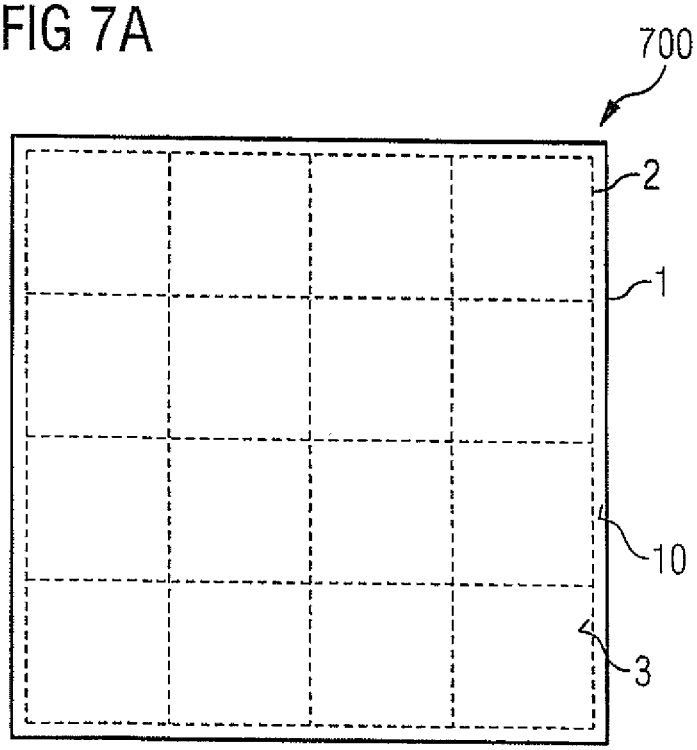
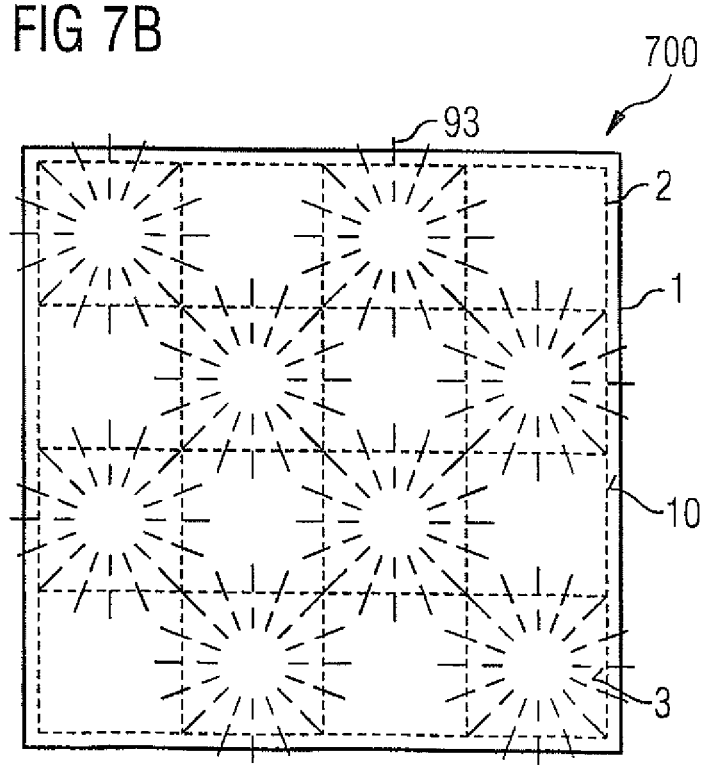

RADIATION-EMITTING ARRANGEMENT

RELATED APPLICATIONS

This is a U.S. national stage of application No. PCT/DE2009/000279, filed on Feb. 25, 2009.

This application claims the priority of German application no. 10 2008 011 239.9 filed Feb. 26, 2008 and 10 2008 023 874.0 filed May 16, 2008, the entire contents of both of which are hereby incorporated by reference.

FIELD OF THE INVENTION

The present invention is related to a radiation-emitting arrangement.

BACKGROUND OF THE INVENTION

In the field of modern architecture and creative design, the choice of materials is accorded crucial importance nowadays in order, on the one hand, to ensure the desired functionality but also, on the other hand, to impart a desired effect in accordance with the external design. By means of targeted illumination it is possible, for example, for the effect of different materials to be correspondingly intensified or for the surface constitution to be highlighted in a targeted manner. In known applications, the illumination always has to be effected externally by the corresponding locations being irradiated or illuminated with the desired light. In many cases, however, external illumination is not possible or requires a not inconsiderable technical and financial outlay.

A surface which is illuminated without external illumination and whose material-specific appearance such as, for instance, wood grain, metallic luster, colors or the like is maintained has not been known heretofore.

SUMMARY OF THE INVENTION

It is an object of at least one embodiment to provide a radiation-emitting arrangement comprising an organic radiation-emitting component.

A radiation-emitting arrangement in accordance with at least one embodiment comprises, in particular,
  a carrier element having an at least partly non-transparent main surface and
  arranged on the carrier element, an organic radiation-emitting component having an organic layer sequence with an active region between an at least partly transparent first electrode and an at least partly transparent second electrode,
wherein
  the active region is suitable for generating electromagnetic radiation in a switched-on operating state,
  the radiation-emitting arrangement has a radiation exit area for emitting the electromagnetic radiation on that side of the organic radiation-emitting component which faces away from the carrier element, and
  the at least partly non-transparent main surface of the carrier element is perceptible by an external observer through the radiation exit area in a switched-off operating state of the organic radiation-emitting component.

In this case, the fact that one layer or one element is arranged or applied "on" or "above" another layer or another element or else "between" two other layers or elements can mean here and hereinafter that said one layer or one element is arranged directly in direct mechanical and/or electrical contact on the other layer or the other element. Furthermore, it can also mean that said one layer or one element is arranged indirectly on or above the other layer or the other element. In this case, further layers and/or element can then be arranged between one layer and the other.

"At least partly non-transparent" can mean in connection with the main surface of the carrier element, in particular, that the main surface has at least one or a plurality of partial regions which are not transparent to the electromagnetic radiation generated by the active region of the organic radiation-emitting component. In particular, the at least one or the plurality of partial regions of the main surface can also be non-transparent to the entire visible electromagnetic spectrum or a partial spectrum thereof. In this case, the at least one or the plurality of regions of the main surface can be absorbent or reflective for at least one wavelength from the electromagnetic radiation generated by the organic radiation-emitting component in the active region and/or for at least one wavelength from the visible electromagnetic spectrum.

"External observer" is understood here and hereinafter to mean a person with average eyesight and an average visual apparatus. Therefore, an electromagnetic radiation is "perceptible" to an external observer in this connection if it has a wavelength and an intensity suitable for bringing about a visual stimulus in the visual apparatus of the external observer. However, it is possible, for example, for a first electromagnetic radiation not to be perceptible by the external observer within the meaning of the description hereinafter if the first electromagnetic radiation has such a low intensity in comparison with a second electromagnetic radiation that a sensory perception of the first electromagnetic radiation is not possible on account of physico-chemical and/or neurological processes brought about by the second electromagnetic radiation in the visible apparatus of the external observer. That can be designated here and hereinafter as "swamping" of the first electromagnetic radiation by the second electromagnetic radiation. Furthermore, it is possible for a first electromagnetic radiation not to be perceptible by an external observer within the meaning of the description hereinafter if the first electromagnetic radiation has such a small intensity difference and/or wavelength difference and/or spatial difference with respect to a second electromagnetic radiation that the first and the second electromagnetic radiation cannot be resolved separately from one another by the average human visual apparatus. That can be designated here and hereinafter as "too little contrast". The "external observer" and also the feature "perceptible" therefore serve, on the one hand, for quantitative characterization of a wavelength range and a minimum intensity of an electromagnetic radiation, but the characterization of this type should, on the other hand, be understood in light of the physiological and neural properties of the visual apparatus.

A surface can be "perceptible" within the meaning of the arrangement described here if at least part of an electromagnetic radiation which is incident on the surface and illuminates the surface is radiated back from the surface and is perceptible by an external observer within the above meaning. The fact that a surface is perceptible can in this case also mean, in particular, that a surface structure of the surface that is provided by color variations and/or brightness variations and/or form variations is perceptible.

By virtue of the combination of the organic radiation-emitting component described here and the carrier element with the at least partly non-transparent main surface, a highlighting and/or alteration of the appearance of the at least partly non-transparent main surface in the switched-on operating state of the organic radiation-emitting component in comparison with the switched-off operating state can be possible, for example. The appearance of the main surface can be highlightable and/or alterable for example on account of the material and/or surface constitution with regard to color, brightness and/or luster. This can be possible primarily by means of a targeted illumination of the main surface by the organic radiation-emitting component, without external illumination having to be used. Precisely by virtue of the fact that the first electrode, the organic layer sequence and the second electrode are transparent, however, it can also be possible that the at least partly non-transparent main surface of the carrier element is perceptible and observable and maintains its specific material properties and manifestation in the switched-off state of the organic radiation-emitting component. Furthermore, the organic radiation-emitting component on the carrier element can also additionally serve as a protective layer for a sensitive surface of the carrier element.

The at least partly non-transparent main surface can in this case be a main surface of the carrier element which faces away from the organic radiation-emitting component. That can mean that the at least partly non-transparent main surface is arranged in a manner facing away from the organic radiation-emitting component and that the organic radiation-emitting component is arranged on a main surface of the carrier element which lies opposite the at least partly non-transparent main surface. In this case, the carrier element can comprise a transparent material on that side of the at least partly non-transparent main surface which faces the organic radiation-emitting component. In this case, the transparent material can comprise glass and/or a transparent plastic, for example, or be composed of at least one of these materials. The at least partly non-transparent main surface can thus be perceptible through the radiation exit area of the radiation-emitting arrangement and through the transparent material of the carrier element at least in a switched-off operating state of the organic radiation-emitting component.

The at least partly non-transparent main surface can alternatively also be a main surface of the carrier element which faces the organic radiation-emitting component. In particular, the carrier element can in this case also comprise or consist of one or a plurality of non-transparent materials.

Furthermore, the at least partly non-transparent main surface can additionally or alternatively comprise or be formed by at least one or a plurality of non-transparent materials. In particular, in this case, the at least partly non-transparent main surface of the carrier element can comprise a coating comprising at least one or a plurality of non-transparent materials. In this case, a coating can be applied on a transparent or non-transparent material which together with the coating can form the carrier element. "Applied" can mean here and hereinafter in particular sprayed, vapor-deposited, adhesively bonded, laminated or a combination thereof.

The at least one or the plurality of non-transparent materials can be selected from stone, wood, plastic, textiles, metal, metal alloy, paper, cardboard, colored glass and any combination of one or a plurality of said materials. In this case, the carrier element can consist, in particular, of one or a plurality of the abovementioned materials at least in the region of the at least partly non-transparent main surface.

Particularly in the case of a coating as described above, the at least one or the plurality of non-transparent materials can also comprise or be a covering substance as an alternative or in addition to the abovementioned materials. In this case, a covering substance can comprise liquid to pasty substances and/or mixtures which, applied on surfaces, produce a solid layer. In this case, a covering substance can comprise, for example, binders, colorants and/or pigments, fillers, solvents, thickeners, dispersants and/or preservatives. By way of example, the covering substance can be embodied as varnish, emulsion paint or plaster. The binders can comprise, for example, oils of oil paints, acrylic resin, epoxy resin, acrylate polymers, vinyl acetate copolymers, caustic lime, cement, anhydrite and/or potassium water glass. Furthermore, the at least one or the plurality of non-transparent materials, in the case of a coating as mentioned above, can also comprise for example an anodization, for example of a metal surface.

The carrier element and therefore the radiation-emitting arrangement can be, in particular, part of a technical, artistic or architectural apparatus. Purely by way of example mention shall be made here of a wall, a ceiling, a cupboard, a worktop, a marble slab, a wooden board, a staircase, a display cabinet, a floorcovering, a housing of an appliance, a vehicle, a toy, a design element, a façade of a building, an escape route, a sign, a road sign, an indication panel and an information panel, a signpost, lettering, a house number sign, a door plate and a nameplate.

The organic radiation-emitting component can be applied immediately and directly on the carrier element. That can mean that a layer of the organic radiation-emitting component is in direct mechanical contact with the carrier element. In this case, the layer can be, for example, a substrate described further below, an encapsulation described further below, or a part thereof, or one of the first and second electrodes.

Furthermore, the radiation-emitting arrangement can have an intermediate layer between the carrier element and the organic radiation-emitting component. That can be advantageous particularly when the main surface of the carrier element which faces the organic radiation-emitting component, which, as described above, can also be the at least partly non-transparent main surface, has a surface structure such as, for instance, elevations, depressions, points, mechanical short-circuit particles and/or a roughness. In this case, the intermediate layer can be embodied as a planarization layer by means of which a planar application area for the organic radiation-emitting component can be made possible.

In this case, the intermediate layer can comprise a transparent solid material in amorphous or crystalline form, for instance gas, a plastic, a semiconductor, metal or a combination of one or a plurality of the materials mentioned. Furthermore, the intermediate layer can comprise a transparent viscous or liquid material, for instance an oil, a gel, a resin, a silicone oil or a silicone gel.

The intermediate layer can furthermore comprise a gas or be formed by a gas, for instance one or a plurality selected from air, a noble gas, nitrogen, oxygen, carbon dioxide and carbon monoxide.

Furthermore, the intermediate layer can serve for the mechanical fixing of the organic radiation-emitting component on the carrier element and, for this purpose, for example comprise an adhesive or be composed of an adhesive. In this case, the adhesive can be applied as an additional layer or else be part of a self-adhesive film, for example. The intermediate layer can therefore enable, for example, a cohesive connection between the carrier element and the organic radiation-emitting component. Furthermore, the intermediate layer can in this case also enable a positively locking connection, particularly in an embodiment as a planarization layer.

The carrier element and the organic radiation-emitting component can, for example, be producible separately from one another and be applied one on top of the other with the aid of the intermediate layer and thus be joined together.

The organic electronic component can, in particular, comprise an organic, radiation-emitting diode (OLED) or be embodied as such. In the case of an OLED, electrons and holes can recombine in the active region with generation of the electromagnetic radiation.

In particular, the organic radiation-emitting component can have a substrate, for example. The first electrode can be applied and arranged on the substrate. The organic layer sequence comprising at least one organic functional layer or a plurality of functional layers composed of organic materials can be applied above the first electrode. In this case, the at least one organic functional layer or the plurality of functional layers can comprise, for example, one or a plurality of electron transport layers, electroluminescent layers, hole transport layers, electron blocking layers and/or hole blocking layers or be embodied as such. The second electrode can be applied above the organic layer sequence.

By way of example, the substrate can comprise or be composed of glass, quartz, a plastic film, metal, a metal film, a silicon wafer or some other suitable substrate material. In this case, the substrate is embodied in a transparent fashion and can be rigid or flexible. In particular a flexible substrate can enable a flexible organic radiation-emitting component which, independently of the form of the carrier element, can be applied to the latter and arranged on the latter in a technically simple manner.

The organic radiation-emitting component can be arranged with the substrate directly or indirectly by way of an intermediate layer, as described above, on the carrier element. That can mean that the substrate is arranged between the carrier element and the organic layer sequence. Furthermore, the organic radiation-emitting component can be arranged with a surface facing away from the substrate directly or indirectly on the carrier element. That can mean that the organic layer sequence is arranged between the substrate and the carrier element. In this case, a main surface of the substrate which faces away from the carrier element can form the radiation exit area of the radiation-emitting arrangement.

Furthermore, the carrier element can also be embodied as a substrate. That can mean that the first electrode, the organic layer sequence and the second electrode are arranged without an additional substrate on the carrier element directly or indirectly by way of an intermediate layer.

The at least partly transparent first electrode can be embodied as an anode and therefore serve as hole-injecting material. The at least partly transparent second electrode can be embodied as a cathode and therefore serve as electron-injecting material. Alternatively, it is also possible for the first electrode to be embodied as a cathode and the second electrode as an anode.

The first and/or the second electrode can, for example, comprise a transparent conductive oxide or consist of a transparent conductive oxide. Transparent conductive oxides ("TCO" for short) are transparent, conductive materials, generally metal oxides such as, for example, zinc oxide, tin oxide, cadmium oxide, titanium oxide, indium oxide or indium tin oxide (ITO). Alongside binary metal-oxygen compounds such as, for example ZnO, $SnO_2$ or $In_2O_3$, ternary metal-oxygen compounds such as, for example, doped zinc oxide compounds, for instance aluminum-doped zinc oxide, or $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs need not necessarily correspond to a stoichiometric composition and can also be p- or n-doped.

Alternatively or additionally, the first and/or the second electrode can comprise or be composed of metal such as, for instance, aluminum, barium, indium, silver, gold, magnesium, copper, calcium or lithium or compounds, combinations and alloys thereof. In particular, the first electrode and/or the second electrode can have a layer comprising one or a plurality of the abovementioned materials having a thickness of less than 100 nm, in particular of less than 50 nm, and particularly preferably less than or equal to 30 nm. In this case, the first and/or the second electrode is all the more transmissive to electromagnetic radiation, the smaller the thickness.

Alternatively or additionally, the first and/or the second electrode can comprise an electrically conductive organic material such as, for instance, PEDOT or carbon nanotubes.

By way of example, the first electrode and/or the second electrode can also have a layer stack having a plurality of layers composed of the above-mentioned materials. The layer stack can have, for example, a metal layer between two TCO layers.

Furthermore, the first electrode and/or the second electrode can additionally have an electrically conductive layer structured as conductor tracks or as a grid, for instance a metal layer structured in this way, having a thickness of up to a few micrometers, in order to increase the transverse conductivity in the case of a large-area first and/or second electrode without significantly reducing the transparency.

The organic functional layer or the plurality thereof can comprise organic polymers, organic oligomers, organic monomers, organic small, non-polymeric molecules ("small molecules") or combinations thereof. In particular, it can be advantageous if the organic radiation-emitting component has a functional layer embodied as a hole transport layer in order to enable effective hole injection into an electroluminescent layer embodied as an active region or into an electroluminescent region. Depending on the materials in the functional layers, the electromagnetic radiation generated in the active region can have individual wavelengths or ranges or combinations thereof from the blue to red spectral range. In particular, the electromagnetic radiation can also give a mixed-colored, for instance a white-colored, luminous impression. Furthermore, the organic radiation-emitting component can enable a variable color emission which can be varied by means of voltage, current, temperature, moisture, pressure or a combination thereof.

The first and/or the second electrode can in each case be embodied in a large-area fashion. A large-area emission of the electromagnetic radiation generated in the active region can be made possible as a result. In this case, "large-area" can mean that the organic radiation-emitting component has an area of greater than or equal to a few square millimeters, preferably greater than or equal to one square centimeter, and particularly preferably greater than or equal to one square decimeter. Alternatively or additionally, the first and/or the second electrode can be embodied in a structured fashion at least in partial regions. As a result, a structured emission of the electromagnetic radiation generated in the active region can be made possible, for instance in the form of pixels or pictograms.

Furthermore, the organic radiation-emitting component can have a transparent encapsulation in order to achieve protection against moisture and/or oxidizing substances such as oxygen, for instance, for the first and second electrode and the organic layer sequence, for example. In this case, the encapsulation can comprise one or a plurality of layers, wherein the layers of the encapsulation can be, for example, planarization layers, barrier layers, water and/or oxygen absorbing layers, connecting layers or combinations thereof. The encapsulation can comprise, for example, a covering in the form of a cap, in particular of a self-supporting cap, and/or a layer or layer sequence in the form of a thin-film encapsulation on or above the electrodes and the organic layer sequence. Suitable materials can comprise or be, for example, glass, plastics, metals, metal oxides, non-metal oxides or non-metal nitrides such as, for instance, $SiO_x$ or $SiN_x$, ceramics or combinations thereof. In this case, the encapsulation can comprise barrier layers and/or planarization layers, for example. Furthermore, the covering can also be embodied as a laminate.

The encapsulation can completely surround and enclose the first and second electrodes and also the organic layer sequence. Furthermore, the encapsulation can also comprise the substrate described above, such that part of the encapsulation can also be formed by the substrate. In particular, the encapsulation can also form the radiation exit area of the radiation-emitting arrangement.

The organic radiation-emitting component can furthermore be arranged with the encapsulation directly or indirectly by way of an intermediate layer on the carrier element.

In addition, a getter material can be applied within the encapsulation. The getter material used can preferably be an oxidizable material which can react with oxygen and moisture and bind these harmful substances in the process. In particular metals from the group of alkali and alkaline earth metals are used as readily oxidizing materials. By way of example, the getter material can comprise magnesium, calcium, barium and/or cesium. Furthermore, other metals such as, for example, aluminum, zirconium, tantalum, and/or titanium, or oxidizable nonmetallic materials can also be suitable. Furthermore, the getter material can comprise materials from the zeolite group and/or silica gel.

The getter material can be embodied for example in a transparent fashion, for example by virtue of such a small thickness that the getter material is at least partly transparent to the electromagnetic radiation generated in the active region of the organic layer sequence. In this case, the getter material can be arranged for example between the radiation exit area of the radiation-emitting arrangement and the carrier element, such that the at least partly non-transparent main surface of the carrier element is perceptible through the getter material at least in a switched-off operating state of the organic radiation-emitting component. Alternatively or additionally, the getter material can also be arranged in a manner laterally offset with respect to the radiation exit area, such that the getter material, with respect to the viewing direction of an external observer, is not arranged between the radiation exit area and the at least partly non-transparent main surface of the carrier element. In this case, the getter material can also be embodied in a non-transparent fashion.

The organic radiation-emitting component can furthermore be embodied as an optical cavity for the electromagnetic radiation generated in the active region. In this case, an "optical cavity" can mean here and hereinafter, in particular, that the organic radiation-emitting component forms an optical resonator in which electromagnetic radiation can preferably be generated with one or a plurality of specific wavelengths and/or one or a plurality of specific emission directions, which can also be designated as resonances or modes. For this purpose, by way of example, the first electrode, the organic layer sequence and the second electrode can be embodied as an optical cavity. That can mean that the at least partly transparent first electrode and the at least partly transparent second electrode additionally also have a reflectivity to the electromagnetic radiation generated in the active region. Alternatively or additionally, the first electrode, the organic layer sequence and the second electrode can be arranged between partly reflective layers which are additionally also partly transparent. The following description of the optical cavity is explained purely by way of example for partly reflective electrodes and can be applied to alternative configurations for the person skilled in the art.

The first electrode and/or the second electrode can have a reflectance R and/or R', respectively, and the organic layer sequence can have a refractive index n for the electromagnetic radiation. Since the first and second electrodes are partly transparent, R<1 and R'<1 hold true in this case. The refractive index n can be constant over the organic layer sequence or be constant at least in partial regions, for example in different functional layers. Furthermore, the refractive index n can also vary over the organic layer sequence. The active region of the organic layer sequence can have a thickness d and be arranged in a manner spaced apart at an average distance L from the first electrode and at an average distance L' from the second electrode. In this case, the average distance L and the average distance L' designate the distances relative to the first electrode and relative to the second electrode, respectively, averaged over the thickness d of the active region. In this case, the parameters R, R', n, d, L and L' can be chosen in such a way that the organic layer sequence has a specific emission characteristic. By way of example, the reflectances R and R' of the first and second electrodes and a refractive index n of the organic layer sequence can be predefined on the basis of the respective choice of materials, such that the desired emission characteristic can be made possible by the choice of the average distances L and L' and the thickness d of the active region. As an alternative to this, the dimensions of the organic layer sequence and of the active region, that is to say the average distances L and L' and the thickness d, can be predefined, for example by means of the construction or the method of production of the organic radiation-emitting component. In this case, the desired emission characteristic can be made possible by means of the choice of the material for the first and second electrodes by way of the reflectances R and R' thereof.

By way of example, the average distances L and L' can be of the order of magnitude of the wavelength of the electromagnetic radiation generated in the active region, or less than that. If the electromagnetic radiation has a spectral distribution of a plurality of wavelengths and/or wavelength ranges, the electromagnetic radiation can in this case also be characterized by an average wavelength and the dimensions of the organic layer sequence here and hereinafter can be related to the average wavelength of the electromagnetic radiation. Furthermore, the average distances can also be less than or equal to half the wavelength of the electromagnetic radiation or less than or equal to one quarter of the wavelength of the electromagnetic radiation or less than or equal to one eighth of the wavelength of the electromagnetic radiation. Furthermore or in addition, the average distances L and L' can be greater than or equal to $\frac{1}{20}$ of the wavelength of the electromagnetic radiation or greater than or equal to $\frac{1}{10}$.

Such average distances L and L', in conjunction with the partly reflective first and second electrodes, can bring about the formation of an at least semilaterally reflective cavity in the radiation-emitting layer sequence. A photon or wave packet emitted by an excited state (exciton) in the active region can in this case be reflected at the first electrode and at the second electrode. By virtue of the fact that the average distances L and L' can be of the order of magnitude of the wavelength of the electromagnetic radiation or less, it is the case that, using simplified phrasing, a feedback of the emitted wave packet with the excited state may also be possible during the emission of the wave packet, such that the excited state, during the emission of the wave packet, can be influenced by the electromagnetic field of its "own" reflected wave packet. An amplification or attenuation of the emission of the excited state can therefore be made possible dependent on the phase angle of the reflected wave packet. In this case, the phase angle can be dependent on the refractive index of the organic layer sequence, the reflectivities of the first and second electrodes in conjunction with the penetration depth of the electromagnetic radiation into the first and second electrodes, and also on the distances between the excited state and the first and second electrodes in conjunction with the emission direction of the wave packet. As a result, a mode structure which can foster and/or bring about emission of the electromagnetic radiation in specific directions can form in the organic layer sequence. Furthermore, the thickness of the active region can also influence the formation of emission modes.

The organic component can have an emission characteristic of the electromagnetic radiation generated in the active region, such that the electromagnetic radiation is emitted with a first intensity in the direction of the carrier element and with a second intensity in the direction of the radiation exit area. In this case, the first intensity and the second intensity can be defined at outer areas of the organic radiation-emitting component, that is to say for example at surfaces of the first or second electrode, of a substrate or an encapsulation, which surfaces face away from the organic layer sequence. In this case, the second intensity can also be defined at the radiation exit area of the radiation-emitting arrangement. "Intensity in the direction" of the carrier element and of the radiation exit area, respectively, can designate, for the first and second intensities, the respective total intensity into the half-spaces on that side of the organic radiation-emitting component which faces and respectively faces away from the carrier element.

In this case, the electromagnetic radiation with the first intensity, which is emitted by the organic radiation-emitting component in the direction of the carrier element, can illuminate the at least partly non-transparent main surface of the carrier element. By virtue of the fact that the main surface is at least partly non-transparent, at least part of the electromagnetic radiation with the first intensity can be reflected in the direction of the radiation exit area and be perceptible by an external observer through the radiation exit area. In other words, that can mean that, for an external observer, the at least partly non-transparent main surface of the carrier element is illuminated and thus perceptible in a switched-on operating state of the organic radiation-emitting component. That can be the case, in particular, if the first intensity is greater than the second intensity.

Such an emission characteristic can be made possible in this case for example by means of an optical cavity as described above. Alternatively or additionally, the first and second electrodes can have mutually different transmittivities. If, for instance, the first electrode is arranged on that side of the organic layer sequence which faces the carrier element and it has a greater transmittivity than the second electrode, it can be possible that the electromagnetic radiation generated in the active region is emitted with a first intensity in the direction of the carrier element, which first intensity is greater than the second intensity.

As an alternative thereto, the second intensity can be greater than the first intensity. Such an emission characteristic can once again be made possible for example by means of an optical cavity. Alternatively or additionally, by way of example, the second electrode can be arranged on that side of the organic layer sequence which faces away from the carrier element and it can have a greater transmittivity than the first electrode. In this case, it can be possible that the at least partly non-transparent main surface of the carrier element is less clearly perceptible in comparison with the switched-off operating state of the organic radiation-emitting component since an external observer can perceive the electromagnetic radiation with the first intensity, reflected by the at least partly non-transparent main surface, and the electromagnetic radiation with the second intensity, emitted directly via the radiation exit area of the radiation-emitting arrangement, as a superimposition. Furthermore, in the switched-on operating state, the at least partly non-transparent main surface can be no longer perceptible at all if the electromagnetic radiation with the first intensity, reflected at the at least partly non-transparent main surface, is swamped by the electromagnetic radiation with the second intensity within the above meaning.

Thus, the organic radiation-emitting component and the radiation exit area can appear transparent in the switched-off operating state and can appear non-transparent or likewise at least partly transparent in the switched-on operating state, depending on the ratio of the first intensity to the second intensity.

The organic radiation-emitting component can be embodied in a structured fashion for example such that, in the switched-on operating state of the organic radiation-emitting component, the at least partly non-transparent main surface is perceptible through first regions of the radiation exit area and is not perceptible through second regions. In this case, the organic radiation-emitting component can for example emit electromagnetic radiation only in partial regions or else emit electromagnetic radiation in a large-area fashion. By virtue of such segmented illumination of the main surface and/or segmented emission of the electromagnetic radiation in the direction of an external observer, it can be possible that, for example, different illumination patterns can be generated or indications or information can temporarily be introduced. In the switched-off operating state, said patterns, indications and/or information are not visible and do not impair the manifestation and the perceptibility of the at least partly non-transparent main surface.

Furthermore, the radiation-emitting arrangement can have a filter layer, which is arranged on that side of the carrier element which faces the organic radiation-emitting component. In this case, the filter layer can be arranged between the organic radiation-emitting component and the carrier element or between the organic radiation-emitting component and the radiation exit area. In the latter case, the filter layer can also form the radiation exit area of the radiation-emitting arrangement.

The filter layer can have a wavelength-dependent and/or an intensity-dependent transmission coefficient. By way of example, the filter layer can comprise an absorbent dye, a wavelength conversion substance, a saturable absorber material or a combination thereof. Furthermore, the filter layer can have a voltage-dependent transmission coefficient, for example. For this purpose, the filter layer can comprise a material that is absorbent in a voltage-dependent manner and/or effects scattering in a voltage-dependent manner, for instance an electrochromic material or liquid crystals in a polymer matrix, which is arranged between two transparent electrodes, for instance composed of a TCO. In this case, the filter layer can be embodied as so-called "smart glass", for example.

The filter layer can additionally also be structured and have different functionalities in different partial regions. The manifestation of the at least partly non-transparent main surface in the switched-on and/or in the switched-off operating state of the organic radiation-emitting component can be modifiable and alterable by means of the filter layer.

BRIEF DESCRIPTION OF THE DRAWINGS

FIGS. 2 to 6 show schematic sectional illustrations of radiation-emitting arrangements in accordance with further exemplary embodiments, and FIGS. 7A to 8B show schematic plan views of radiation-emitting arrangements in accordance with further exemplary embodiments.

DETAILED DESCRIPTION OF THE DRAWINGS

In the exemplary embodiments and figures, identical or identically acting constituent parts may in each case be provided with the same reference symbols. The elements illustrated and their size relationships among one another should not be regarded as true to scale, in principle; rather, individual elements such as, for example, layers, structural parts, components and regions may be illustrated with exaggerated thickness or size dimensions in order to enable better illustration and/or in order to provide a better understanding.

Figure 1A:
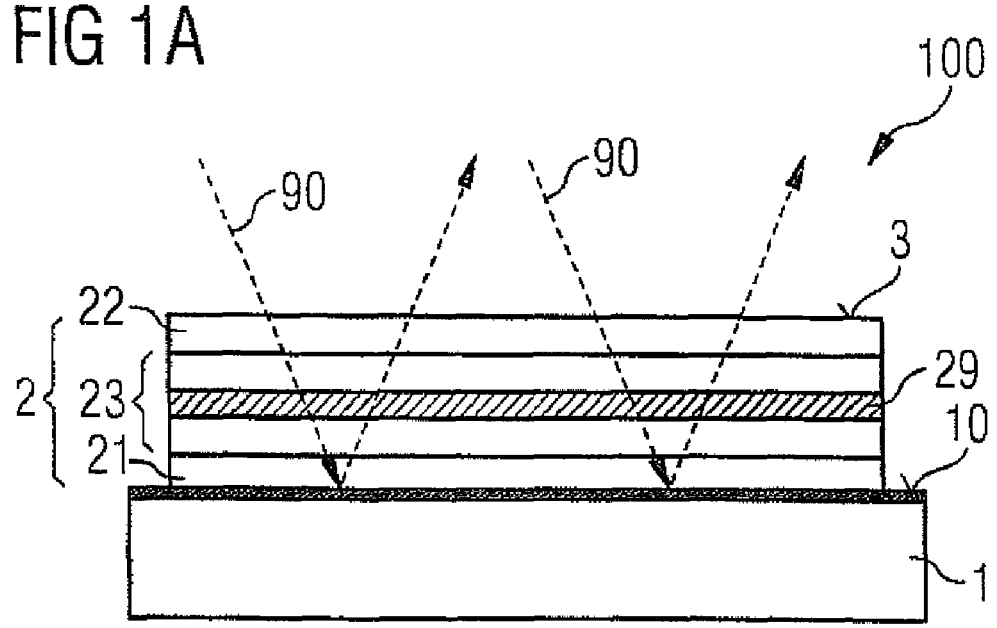
FIGS. 1A and 1B show schematic sectional illustrations of a radiation-emitting arrangement in accordance with one exemplary embodiment.
Figure 1B:
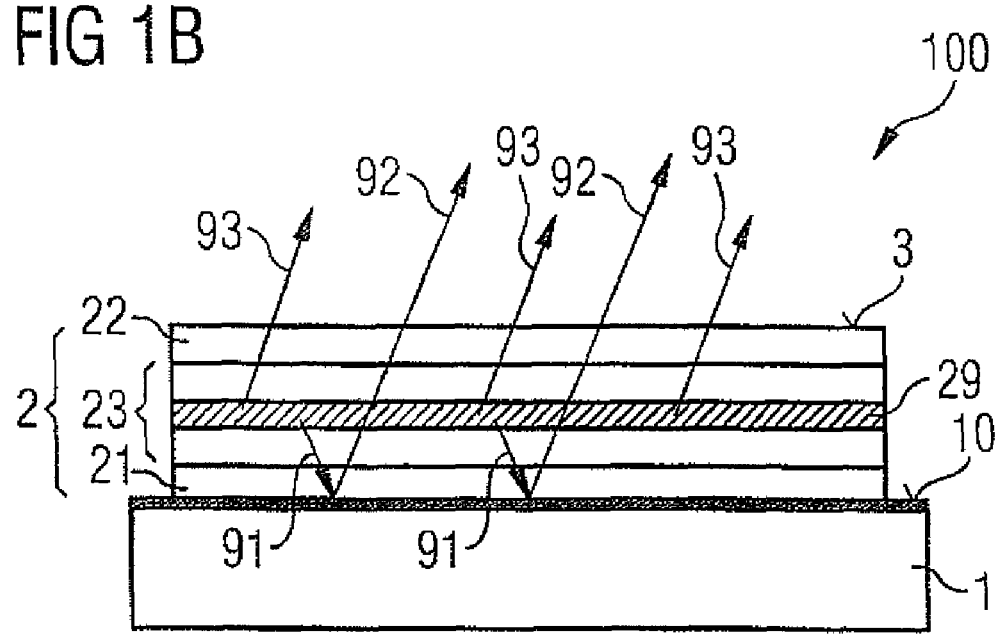

FIGS. 1A and 1B show an exemplary embodiment of a radiation-emitting arrangement 100. In this case, FIG. 1A shows a switched-off operating state, while FIG. 1B shows a switched-on operating state. Unless indicated otherwise, the following description relates equally to FIGS. 1A and 1B.

The radiation-emitting arrangement 100 has a carrier element 1, on which an organic radiation-emitting component 2 is arranged.

The carrier element 1 has an at least partly non-transparent main surface 10, on which the organic radiation-emitting component 2 is arranged. In the exemplary embodiment shown, the carrier element 1, purely by way of example, is composed of a colored, non-transparent plastic and can be, for example, part of a decorative plate or of a tile or tiling. In this case, the main surface 10 is likewise colored and non-transparent. In this case, in the exemplary embodiment shown, the main surface 10 has an artistically designed color structure which can reflect different spectral components of daylight or of the ambient light, indicated by the electromagnetic radiation 90 in FIG. 1A. The color structure of the main surface 10 is not shown in FIGS. 1A and 1B for the sake of clarity.

Through a radiation exit area 3 of the radiation-emitting arrangement 100, which faces a possible external observer, the at least partly non-transparent main surface 10 is perceptible to the external observer in the switched-off operating state of the organic radiation-emitting component 2 in accordance with FIG. 1A. For this purpose, the carrier element 1, as described above in the form of a decorative plate, tiling or tile, can be fixed to a wall, for example to an internal wall, or be embodied as part of the wall.

The organic radiation-emitting component 2 has a first electrode 21 on the carrier element 1, on which first electrode an organic layer sequence 23 and thereabove a second electrode 22 are arranged. In this case, the first electrode 21 and the second electrode 22 are at least partly transparent, such that, as shown in FIG. 1A, at least part of the ambient light 90 can pass through the organic radiation-emitting component 2 and can be reflected at the main surface 10 in the direction of the radiation exit area 3, thus resulting in the above-described perceptibility of the main surface 10 to an external observer. In the exemplary embodiment shown, the radiation exit area 3 is formed by that surface of the second electrode 22 which faces away from the organic layer sequence 23.

The organic layer sequence 23 between the at least partly transparent first electrode 21 and the at least partly transparent second electrode 22 has an active region 29, which can generate electromagnetic radiation 91, 93 in a switched-on operating state in accordance with FIG. 1B. The organic radiation-emitting component 2 is embodied as an organic light-emitting diode (OLED) and has, as described in the general part, functional layers for hole and electron transport and also an electroluminescence layer embodied as an active region 29. The electromagnetic radiation 91, 93 gives a white-colored luminous impression in the exemplary embodiment shown.

The carrier element 1 can have a suitable electrical drive unit for the voltage and current supply of the organic radiation-emitting component 2, which is connected via electrical contacts or contact tracks as extensions to the electrodes 21 and 22 (not shown). The active region 29 and the electrical drive unit can also be embodied in such a way that the electromagnetic radiation 91, 93 generated by the active region 29 is dimmable and/or alterable with regard to the color temperature or the color impression. Such configurations are known to the person skilled in the art and will not be explained in any greater detail here. Furthermore, the size of the luminous area, that is to say of the radiation exit area 3, is free and can be chosen freely by the person skilled in the art in a known manner from standpoints such as efficiency and current consumption.

In this case, the electromagnetic radiation generated by the active region 29 is emitted with a first intensity in the direction of the main surface 10 of the carrier element 1, as is indicated by the electromagnetic radiation 91. At least part thereof, indicated by the electromagnetic radiation 92, is reflected to the radiation exit area 3 and can be perceived by an external observer. The external observer can thereby have the sensory impression of an illuminated main surface 10.

The electromagnetic radiation generated by the active region 29 is furthermore emitted with a second intensity in the direction of the radiation exit area 3, as is indicated by the electromagnetic radiation 93. The relative ratio of first and second intensities to one another can be settable and selectable, as described in the general part, by means of an optical cavity or else by means of differently transparent first and second electrodes 21, 22.

In addition to the electromagnetic radiation 92 and/or it can also be possible, in principle, for the external observer also to perceive the ambient light 90 (shown in FIG. 1A) that is reflected at the main surface 10. However, it can also be possible for the ambient light 90 reflected at the main surface 10 to be swamped by the electromagnetic radiation 92 that is generated by the active region and is reflected by the main surface 10, such that an external observer cannot perceive the reflected ambient light 90 within the meaning described above.

By virtue of the transparent embodiment of the organic radiation-emitting component 2, the main surface 10 of the carrier element 1 that lies behind said component, in the switched off operating state, appears in its original form and color and thus maintains the impression of its characteristic material properties for an external observer. Depending on the setting of the emission ratio between the front- and rear-side emission, that is to say the emission toward the radiation exit area 3 with the second intensity and respectively toward the carrier element 1 with the first intensity, it is possible to achieve different effects in the switched-on operating state. If the emission is effected predominantly in the direction of the carrier element 1, that is to say if the second intensity is less than the first intensity, then this results in an effective, spacesaving illumination of the material lying behind and thus of the main surface 10. By means of the choice of the illuminance, material properties can be highlighted in a targeted manner since, through the transparent organic radiation-emitting component 2, the material lying behind can be viewed in the switched-on state as well. By contrast, if the emission is effected predominantly in the direction of the radiation exit area 3 and thus in the direction of an external observer, in the switched-on operating state a luminous area will be seen, and the material lying behind, that is to say the main surface 10, will not be visible depending on the contrast ratio. This also enables, in particular, given a corresponding structuring of the organic radiation-emitting component 2, the insertion of indications or information on the radiation exit area 3.

By means of a suitable choice of the wavelength, the intensity and the emission direction of the electromagnetic radiation 91, 93, it is thus possible to influence the manifestation of the main surface 10 in the switched-on operating state of the organic radiation-emitting component and to advantageously highlight the color structure of the main surface 10, for example. Furthermore, the radiation-emitting arrangement 100 can be used as an illumination element.

As an alternative to the exemplary embodiment shown, the carrier element 1 can also have a plurality of organic radiation-emitting components, which can be electrically connected in parallel or in series or independently of one another alongside one another or one above another. In this case, the entire main surface 10 of the carrier element 1 can serve as a carrier area for one or a plurality of organic radiation-emitting components, wherein the form of the radiation exit area 3 can be chosen freely. In this case, the carrier element 1 can also be embodied as a segmented luminous tile.

The following figures show modifications and variations of the exemplary embodiment shown in FIGS. 1A and 1B. Therefore, the following description relates principally to the differences and developments in comparison with the previous exemplary embodiment.

FIG. 2 shows an exemplary embodiment of a radiation-emitting arrangement 200 wherein the at least partly non-transparent main surface 10 is arranged in a manner facing away from the organic radiation-emitting component 2. For this purpose, the carrier element 1 comprises a transparent material on that side of the main surface 10 which faces the organic radiation-emitting component 2. In the exemplary embodiment shown, the carrier element 1 is composed of glass having, as the at least partly non-transparent main surface 10, a non-transparent coating composed of a varnish. In this case, the coating can be applied before or after the application of the organic radiation-emitting component 2 on the carrier element 1.

FIG. 3 shows an exemplary embodiment of a radiation-emitting arrangement 300 wherein an intensity- and wavelength-dependent filter layer 5 is arranged between the carrier element 1 and the organic radiation-emitting component 2. The filter layer 5 is embodied in partly transparent fashion with a saturable wavelength conversion substance. In a switched-off operating state, in this case part of the ambient light 90 is absorbed by the filter layer 5 and converted into a different wavelength and scattered, such that the main surface 10 of the carrier element 1 appears colored and an external observer can be given an opalescent glass-like viewing impression.

In a switched-on operating state (not shown), the first intensity, that is to say the intensity of the electromagnetic radiation which is generated in the active region 29 and emitted in the direction of the carrier element 1, is high enough to saturate the filter layer 5, such that the predominant portion of the electromagnetic radiation with the first intensity serves for imaging the main surface 10 in a manner directly perceptible to an external observer and without the colored impression of the filter layer 5. In this case, the electromagnetic radiation generated by the active region 29 gives a white-colored luminous impression. Consequently, the at least partly non-transparent main surface 10 can be perceptible clearly and plainly without discoloration in the switched-on operating state.

As an alternative to the exemplary embodiment shown here, the filter layer 5 can also be arranged on that side of the organic radiation-emitting component 2 which faces away from the carrier element 1, such that the filter layer 5 can form the radiation exit area 3.

FIGS. 4A and 4B show an exemplary embodiment of a radiation-emitting arrangement 400 in a switched-off operating state (FIG. 4A) and in a switched-on operating state (FIG. 4B).

The radiation-emitting arrangement 400 has a filter layer 5 on that side of the organic radiation-emitting component 2 which faces away from the carrier element 1. The filter layer 5 is embodied as a voltage-dependent filter layer having a voltage-dependent transmission coefficient and comprises a liquid crystal material in a polymer matrix. The polymer matrix is arranged between two transparent electrodes composed of TCO (not shown).

Without voltage present at the filter layer 5, the liquid crystals in the polymer matrix are disordered and can therefore scatter the ambient light, as is shown in FIG. 4A. The at least partly non-transparent main surface 10 is thereby perceptible in a manner blurred by an opalescent glass-like effect.

The filter layer 5 is embodied such that a voltage 50 is applied in the switched-on operating state of the organic radiation-emitting component, as is shown in FIG. 4B. As a result of the voltage 50 being applied to the filter layer 5, the liquid crystals can be aligned in such a way that the electromagnetic radiation 93 with the second intensity, generated by the active region, and the electromagnetic radiation 92, which is the electromagnetic radiation 91 reflected from the main surface 10, are not scattered and, consequently, a clear perception of the main surface 10 by an external observer is possible.

FIG. 5 shows an exemplary embodiment of a radiation-emitting arrangement 500.

In the exemplary embodiment shown, an organic radiation-emitting component 2 having a transparent substrate 20 is arranged on the carrier element 1. On the substrate 20, which is embodied as a flexible plastic film, the first electrode 21, the organic layer sequence 23 and the second electrode 22 are applied. An encapsulation 24 is arranged thereabove, said encapsulation being embodied as a multilayered thin-film encapsulation comprising a plurality of barrier layers and planarization layers. The organic radiation-emitting component 2 is thus embodied in a flexible fashion and, as an alternative to the exemplary embodiment shown, can also be arranged on carrier elements which are not planar but rather have a curvature, for example. The encapsulation 24 forms the radiation exit area 3 of the radiation-emitting arrangement 500.

Furthermore, the radiation-emitting arrangement 500 has an intermediate layer 4 arranged between the carrier element 1 and the organic radiation-emitting component 2. In this case, the substrate 20 faces the carrier element 1 and is arranged on the at least partly non-transparent main surface 10 by means of the intermediate layer 4.

In the exemplary embodiment shown, the intermediate layer comprises a transparent resin, thus a silicone or epoxy resin, for instance, which firstly planarizes the at least partly non-transparent main surface 10 and secondly creates a cohesive connection between the carrier element 1 and the organic radiation-emitting component 2. Alternatively, the intermediate layer 4 can also comprise one of the materials mentioned above in the general part.

FIG. 6 shows an exemplary embodiment of a radiation-emitting arrangement 600. As in the preceding exemplary embodiment, the radiation-emitting arrangement 600 has an organic radiation-emitting component 2 having a substrate 20 and an encapsulation 24. In contrast to the preceding exemplary embodiment, in the case of the radiation-emitting arrangement 600, the organic radiation-emitting component 2 is arranged with the encapsulation 24 on the carrier element 1 by means of the intermediate layer 4.

The substrate 20 forms the radiation exit area 3 of the radiation-emitting arrangement 600 and simultaneously serves as a protective layer for the underlying carrier element 1.

With regard to the exemplary embodiments shown here, the radiation-emitting arrangements described here can be used for a multiplicity of applications. Some further concrete applications and exemplary embodiments are explained purely by way of example below, the organic radiation-emitting component 2 mainly being assumed to be an OLED.

In the field of design it is extremely desirable to direct an observer's attention to specific locations or surfaces, for example, or to highlight some surfaces and materials in a targeted manner. This may be the case for design elements and architectural or artistic aspects, for example, by means of variable or luminous surfaces. It can be achieved in an outstanding manner with the described combination of organic radiation-emitting components 2 and the desired object, article or surface in the form of the carrier element 1 having the main surface 10. This principle can be applied to all articles and surfaces of already existing objects having surfaces composed, for example, of wood, marble, stone, plastic, etc. Through the use of flexible transparent substrates for the OLEDs there is, in principle, no restriction to specific surface forms of the carrier element 1. The surfaces of cupboards, worktops, walls, ceilings, staircases, display cabinets, floorcoverings, housings of various appliances, vehicles, toys, design elements, façades of buildings, etc. can be involved in this case. In the switched-off state, the natural effect of the material used can be exhibited. In contrast thereto, as a result of the illumination element being switched on, the specific material impression can be intensified or altered at specific locations or on the entire surface.

In further application examples and exemplary embodiments, information is displayed only for a limited period of time. During the time otherwise, the observer's view of the article or the object is not intended to be influenced or impeded. Through the combination of transparent OLEDs which are applied on any desired surfaces, indication signs or information which can be made visible as necessary can be provided everywhere, in principle. Temporally variable escape routes, indication panels, signposts or lettering can thus be generated.

As a result of segmented illumination of the main surface 10 situated behind, on uniform surfaces it is possible, in principle, to image lettering or patterns from "nowhere". As a result, e.g. on any desired surface such as e.g. a for example black marble slab or a stylish wooden board as carrier element 1, a checkered pattern can be generated by switching on the OLED segments. This is shown in the exemplary embodiment of a radiation-emitting arrangement 700 in accordance with FIG. 7A in a switched-off operating state and in FIG. 7B in a switched-on operating state, in a plan view. In this case, the organic component 2 is embodied in a structured fashion, such that an external observer can be given an illumination impression only in partial regions of the radiation exit area 3.

In previous applications it has been necessary for such patterns to have already been incorporated into the surface. However, if, by way of example, an organic radiation-emitting component 2 embodied as a segmented, transparent OLED, as in the exemplary embodiment shown in accordance with FIGS. 7A and 7B, is applied on a surface of a table or of a floorcovering, this yields a switchable pattern and hence an additional functionality in the switched-on state.

Organic radiation-emitting components 2 embodied as transparent OLEDs which are applied on any desired surfaces of a space or article as carrier element 1 can also serve as illumination elements. Thus, in the switched-off state of the OLED, the original impression of the main surface 10 of the carrier element 1 is maintained in the usual way, while in the switched-on state it is possible to generate the impression that the article or space embodied as carrier element 1 begins to glow. This can be used, for example, to generate a pleasant mood light. In this case, the impression is influenced very quickly by the choice of background material used.

In various cities it will become obligatory in the near future that, by way of example, house number signs must be illuminated or be intrinsically luminous. This can be realized very easily with the principle described here.

Figure 8A:
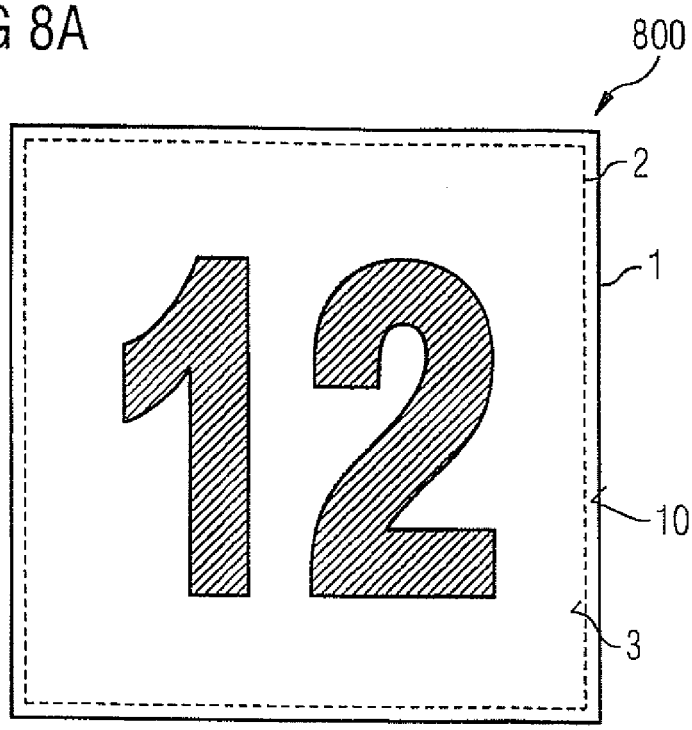
Figure 8B:
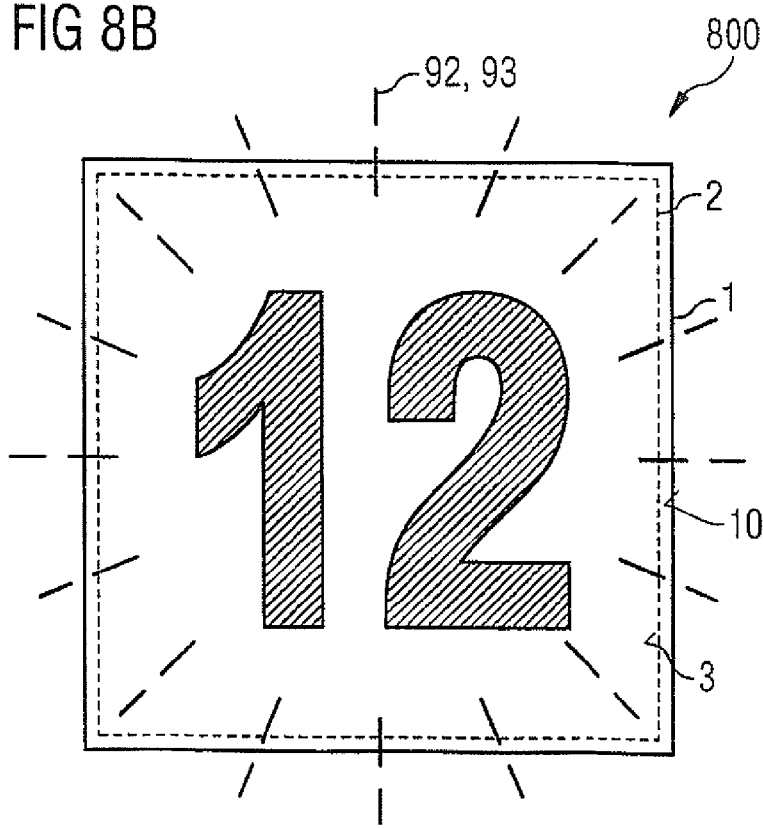

FIGS. 8A and 8B show an exemplary embodiment of a radiation-emitting arrangement 800 in a plan view in the switched-off operating state (FIG. 8A) and in the switched-on operating state (FIG. 8B). In the exemplary embodiment shown, a typical house number sign, for example in the colors white and blue, is fitted as carrier element 1 behind an organic radiation-emitting component 2 embodied as a transparent OLED. In this case, the house number sign is clearly discernible in the switched-off operating state of the organic radiation-emitting component 2.

In darkness, for instance, the house number sign can be homogeneously illuminated in a very simple manner, by virtue of the fact that, as shown in FIG. 8B, the main surface 10 is perceptible as a result of the electromagnetic radiation 92, 93 emitted by means of the radiation exit area 3. The advantage over self-luminous house number signs is that these signs do not have to be individually produced specifically for each house number, rather the carrier element 1 arranged behind the organic radiation-emitting component 2 in the form of a house number or indication sign can be exchanged very easily.

The same principle is also very well suited to the illumination of door plates or nameplates. The nameplate can be read very well without illumination in daylight, and in the twilight or in darkness the nameplate or door plate can be illuminated with the aid of the organic radiation-emitting component 2 and at the same time the desired information can be read.

The same applies to all types of signs, road signs, etc.

In all these cases it can be advantageous, but not restrictive, if the emission of the electromagnetic radiation generated in the active region 29 of the organic radiation-emitting component 2 is predominantly effected toward the rear, that is to say in the direction of the carrier element 1, in order to achieve a highest possible contrast ratio.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A radiation-emitting arrangement, comprising:
a carrier element having an at least partly non-transparent main surface; and
an organic radiation-emitting component arranged on the carrier element, the organic radiation-emitting component having an organic layer sequence with an active region between an at least partly transparent first electrode and an at least partly transparent second electrode;
wherein the active region is configured to generate electromagnetic radiation in a switched-on operating state;
wherein the radiation-emitting arrangement has a radiation exit area for emitting the electromagnetic radiation on that side of the organic radiation-emitting component which faces away from the carrier element;
wherein the at least partly non-transparent main surface of the carrier element is perceptible by an external observer through the radiation exit area in a switched-off operating state of the organic radiation-emitting component;
wherein the organic radiation-emitting component has an emission characteristic of the electromagnetic radiation generated in the active region with a first intensity in a direction of the carrier element and a second intensity in a direction of the radiation exit area;
wherein the second intensity is greater than the first intensity;
wherein the first electrode is arranged on that side of the organic layer sequence which faces the carrier element;
wherein the first electrode has a lower transmittivity than the second electrode;
wherein the at least partly non-transparent main surface of the carrier element is imperceptible to the external observer through the radiation exit area in the switched-on operating state; and
wherein one of the first and the second electrodes is an anode and the other is a cathode.

2. The arrangement as claimed in claim 1, wherein the at least partly non-transparent main surface of the carrier element is arranged in a manner facing away from the organic radiation-emitting component.

3. The arrangement as claimed in claim 2, wherein the carrier element comprises a transparent material comprising glass and/or plastic on the side facing the organic radiation-emitting component.

4. The arrangement as claimed in claim 1, wherein the at least partly non-transparent main surface of the carrier element is arranged in a manner facing the organic radiation-emitting component.

5. The arrangement as claimed in claim 4, wherein the carrier element consists of at least one or a plurality of non-transparent materials.

6. The arrangement as claimed in claim 1, wherein the at least partly non-transparent main surface of the carrier element comprises a coating comprising at least one or a plurality of non-transparent materials.

7. The arrangement as claimed in claim 5, wherein the at least one or the plurality of non-transparent materials are selected from a group, wherein the group is formed by: stone, wood, plastic, textiles, metal, metal alloy, paper, cardboard, covering substance.

8. The arrangement as claimed in claim 1, wherein at least one intermediate layer is arranged between the carrier element and the organic radiation-emitting component, said at least one intermediate layer comprising at least one or a plurality of transparent materials from a group, wherein the group is formed by: glass, plastic, adhesive, semiconductor, an amorphous material, a crystalline material, liquid, gas.

9. The arrangement as claimed in claim 1, wherein the organic radiation-emitting component has a substrate, and wherein the substrate is arranged between the carrier element and the organic layer sequence.

10. The arrangement as claimed in claim 1, wherein the organic radiation-emitting component has a substrate, and wherein the organic layer sequence is arranged between the carrier element and the substrate.

11. The arrangement as claimed in claim 1, wherein the carrier element is embodied as a substrate for the organic radiation-emitting component.

12. The arrangement as claimed in claim 1, wherein the at least partly non-transparent main surface of the carrier element is illuminated by the electromagnetic radiation with the first intensity and reflects the electromagnetic radiation with the first intensity at least partly in the direction of the radiation exit area.

13. The arrangement as claimed in claim 1, wherein a filter layer having at least one of a wavelength-dependent and an intensity-dependent transmission coefficient is arranged on that side of the carrier element which faces the organic radiation-emitting component.

14. The arrangement as claimed in claim 13, wherein the filter layer comprises one of an absorbent dye, a wavelength conversion substance, a saturable absorber material and a combination thereof.

15. The arrangement as claimed in claim 13, wherein the filter layer comprises a voltage dependent transmission coefficient.

* * * * *